United States Patent
Rusconi Clerici Beltrami et al.

(10) Patent No.: US 10,820,091 B2
(45) Date of Patent: Oct. 27, 2020

(54) METHOD FOR OPERATING A PIEZOELECTRIC SPEAKER

(71) Applicant: USOUND GMBH, Graz (AT)

(72) Inventors: Andrea Rusconi Clerici Beltrami, Vienna (AT); Ferruccio Bottoni, Graz (AT); Drago Strle, Ljubljana (SI)

(73) Assignee: USOUND GMBH, Graz (AT)

( * ) Notice: Subject to any disclaimer, the term of this patent is extended or adjusted under 35 U.S.C. 154(b) by 0 days.

(21) Appl. No.: 16/286,870

(22) Filed: Feb. 27, 2019

(65) Prior Publication Data
US 2019/0268689 A1   Aug. 29, 2019

(30) Foreign Application Priority Data

Feb. 28, 2018 (DE) .......................... 10 2018 104 561

(51) Int. Cl.
*H04R 1/24* (2006.01)
*H01L 41/09* (2006.01)
(Continued)

(52) U.S. Cl.
CPC .............. *H04R 1/24* (2013.01); *H01L 41/09* (2013.01); *H04R 3/00* (2013.01); *H04R 3/04* (2013.01);
(Continued)

(58) Field of Classification Search
CPC . H04R 1/24; H04R 3/04; H04R 17/00; H04R 3/00; H04R 2217/03; H04R 29/001; H01L 41/09; H01L 41/042
See application file for complete search history.

(56) References Cited

U.S. PATENT DOCUMENTS 6,111,508 A * 8/2000 Ensor .................. A01K 11/006
   119/51.02
6,829,131 B1 * 12/2004 Loeb .................... H04R 19/005
   361/115
(Continued)

FOREIGN PATENT DOCUMENTS

EP    1 759 427    3/2007
WO   WO 0120948   3/2001
(Continued)

OTHER PUBLICATIONS

European Search Report, EP Application No. 19158634.6-1210, dated Jul. 26, 2019, 12 pages.
(Continued)

*Primary Examiner* — Oyesola C Ojo
(74) *Attorney, Agent, or Firm* — Dority & Manning, P.A.

(57) ABSTRACT

A method for operating a piezoelectric speaker for generating sound waves in the audible wavelength spectrum and/or in the ultrasonic range includes at least partially charging a piezo actuator of the piezoelectric speaker with electrical energy of an energy unit and then at least partially discharging the piezo actuator. The method also includes determining at least one present electrical piezo actuator voltage of the piezo actuator. A future input voltage for the piezo actuator is compared with the present electrical piezo actuator voltage prior to charging and/or discharging, and a future differential voltage is derived therefrom. Furthermore, an embodiment of the method can include returning a part of the energy needed to charge the piezo actuator to the energy unit during discharging.

17 Claims, 6 Drawing Sheets

(51) Int. Cl.
   H04R 3/00 (2006.01)
   H04R 17/00 (2006.01)
   H04R 3/04 (2006.01)
   *H04R 29/00* (2006.01)
   *H01L 41/04* (2006.01)

(52) U.S. Cl.
   CPC ............ *H04R 17/00* (2013.01); *H01L 41/042* (2013.01); *H04R 29/001* (2013.01); *H04R 2217/03* (2013.01)

(56) References Cited

U.S. PATENT DOCUMENTS

| | | | | |
|---|---|---|---|---|
| 6,931,930 | B2* | 8/2005 | Reck | F16F 9/052 73/597 |
| 2005/0013080 | A1* | 1/2005 | Pilz | H01H 9/56 361/115 |
| 2010/0271147 | A1* | 10/2010 | Leibman | H03F 3/217 331/160 |
| 2011/0028868 | A1* | 2/2011 | Spector | G10K 15/06 601/4 |
| 2011/0304240 | A1* | 12/2011 | Meitav | H02N 2/181 310/319 |
| 2011/0305356 | A1* | 12/2011 | Kwan | H04R 3/04 381/190 |
| 2013/0265150 | A1* | 10/2013 | Nakayama | H04R 23/00 340/425.5 |
| 2014/0260922 | A1* | 9/2014 | Jennings | G10H 3/143 84/731 |
| 2015/0377017 | A1* | 12/2015 | McRory | E21B 47/16 367/82 |
| 2017/0368574 | A1* | 12/2017 | Sammoura | H01L 41/0471 |
| 2018/0166981 | A1* | 6/2018 | Leppard | A61M 11/005 |

FOREIGN PATENT DOCUMENTS

| | | |
|---|---|---|
| WO | WO 2009066296 | 5/2009 |
| WO | WO 2016/202642 | 12/2016 |
| WO | WO 2016/202645 | 12/2016 |

OTHER PUBLICATIONS

Spanner, K, et al., "Piezo-Translatoren," Elektronik, vol. 31, No. 6, Mar. 1982, 9 pages.
German Search Report and Written Opinion of the International Searching Authority, Application No. 10 2018 104 561.1, 23 pages.

* cited by examiner

METHOD FOR OPERATING A PIEZOELECTRIC SPEAKER

FIELD OF THE INVENTION

The present invention relates to a method for operating a piezoelectric speaker for generating sound waves in the audible wavelength spectrum and/or in the ultrasonic range, a piezo actuator of the piezoelectric speaker being at least partially charged with electrical energy from an energy unit and then at least partially discharged, whereby sound waves are generated. A present electrical piezo actuator voltage of the piezo actuator is also determined according to the method. The invention further relates to a circuit for operating a piezoelectric speaker.

BACKGROUND OF THE INVENTION

A circuit for a piezoelectric element is known from US 2010/0271147 A1, which is hereby incorporated herein by this reference for all purposes. Transferring electrical energy from an energy store to the piezoelectric element for charging and from the piezoelectric element to the energy store for discharging is described therein. A voltage at the piezoelectric element is further measured and compared with a present input voltage. It is disadvantageous that a quality of a sound reproduced by means of the piezoelectric element according to US 2010/0271147 A1 is insufficient.

BRIEF OBJECTS AND SUMMARY OF THE INVENTION

The object of the present invention is thus to improve the state of the art and is achieved by a method for operating a piezoelectric speaker and a circuit having the features described below.

The invention proposes a method for operating a piezoelectric speaker for generating sound waves in the audible wavelength spectrum. The piezoelectric speaker can be disposed in a smartphone, a set of headphones, an in-ear earpiece, or the like, in order to generate music, sounds, or speech. The sound waves in the audible wavelength spectrum can have frequencies from approximately 20 Hz to 20 kHz, thus being audible to the human ear.

In addition or alternatively, the piezoelectric loudspeaker can also be used to generate sound waves in the ultrasonic range. Such sound waves have frequencies above about 20 kHz. Thus, ultrasonic sound can be generated with the piezoelectric loudspeaker. The piezoelectric loudspeaker can thus be used in medical technology, for example for sonography. However, other applications are also conceivable. For example, the ultrasound generated by the piezoelectric loudspeaker can also be used for distance measurement, in particular echo sounder, for ultrasonic cleaning, for a motion detector, for ultrasonic welding, for ultrasonic levitation, for ultrasonic material testing devices, for ultrasonic linear drives, for ultrasonic flow sensors or for ultrasonic cutting.

According to the method, a piezo actuator of the piezoelectric speaker is at least partially charged with electrical energy from an energy unit and then at least partially discharged, thereby generating sound waves. The electrical energy can thereby be provided by the energy unit. The piezo actuator comprises piezoelectric properties, that is, the piezo actuator can be displaced as a function of the charge state thereof. The greater the charge of the piezo actuator with electrical energy, the greater the displacement of the piezo actuator. The sound waves can be generated by means of the displacing of the piezo actuator if the displacing is transmitted to a membrane, for example. The air disposed above the membrane can thereby be set to vibrating so that the sound waves are generated. The displacing of the piezo actuator can further be modified in that said actuator is charged and discharged. If the piezo actuator is charged further, the displacing can be increased. In order to reduce the displacement, in contrast, the piezo actuator can be discharged. The piezo actuator can thus be set to vibrating by alternately charging and discharging, wherein the vibrations are transmitted to the membrane, for example, such that the sound waves are generated.

According to the method, the electrical energy is transferred from an energy unit to the piezo actuator for charging the piezo actuator. The energy unit can thereby be an energy store, such as a non-rechargeable or rechargeable battery. The piezoelectric speaker can be operated by means of the energy unit. The charging can be performed, as described above, when the piezo actuator is to be further displaced.

The electrical energy is further discharged from the piezo actuator for discharging the piezo actuator according to the method. The discharging can be performed, for example, when the displacement of the piezo actuator is to be reduced. The electrical energy can further be transferred from the piezo actuator into the energy unit, such that said energy is available again. The piezoelectric speaker can thereby be operated more effectively.

Sound waves can thus be generated by controlled displacing of the piezo actuator. If the displacing occurs according to an audio signal, for example comprising tones, sounds, or music, a corresponding noise, also comprising tones, sounds, or music, is generated by means of the piezoelectric speaker. The audio signal can be present in the form of a music file, for example. The audio signal can also be provided by a conversational partner on a phone call, for example.

By charging and discharging with electrical energy, an electrical voltage at the piezo actuator also rises and falls. As the voltage at the piezo actuator increases, the displacement rises. The displacement further falls as the volt-age at the piezo actuator drops. The piezo actuator further has a capacitance, as an electrical field is established by the charging of the piezo actuator with electrical energy as a function of the electrical voltage. The piezo actuator can thus comprise properties of a capacitor. The charge state and the electrical voltage of the piezo actuator and the displacement can also be interdependent.

Furthermore, at least one present electrical piezo actuator voltage of the piezo actuator is determined according to the method. The present electrical piezo actuator voltage is the electrical voltage presently or momentarily present at the piezo actuator. The present piezo actuator voltage is also the voltage with which the piezo actuator is presently or momentarily charged. The displacement of the piezo actuator can thereby be derived, as the displacement is dependent on the electrical piezo actuator voltage.

According to the invention, a future input voltage for the piezo actuator is compared with the present electrical piezo actuator voltage prior to charging. In addition or alternatively, the future input voltage for the piezo actuator can be compared with the present electrical piezo actuator voltage prior to discharging. A future differential voltage is derived therefrom. The future input voltage can thereby be the electrical voltage intended to be present at the piezo actuator at a future time interval, for example a next time interval. The future input voltage can be a specified value for the voltage at the piezo actuator. The future input voltage can also thereby be a future electrical piezo actuator voltage. The future differential voltage can be a voltage compensating for a difference or a differential between the present piezo actuator volt-age corresponding to the displacement and the future input voltage.

If the present or momentary piezo actuator voltage is 29.5 V, for example, which can be measured and/or determined, and the future input voltage intended to be present at the piezo actuator in a next time interval is 30 V, for example, a future differential voltage of 0.5 V can be derived therefrom. In the present example, the piezo actuator voltage is to be increased from the present 29.5 V to the future 30 V. The piezo actuator voltage present at the piezo actuator must therefore be increased by 0.5 V, particularly for the future and/or next time interval. The differential voltage can thus be a compensation voltage. The differential voltage for the next time interval is thereby determined already at the present point in time. In order to be able to generate a tone, music, or speech at a high quality, it is advantageous if the displacing of the piezo actuator takes place as precisely as possible. By calculating the future differential voltage in advance, the displacing can be controlled with high precision. The quality of the generated sound waves comprising a tone, music, or speech is thereby increased.

The future differential voltage can be positive, if the piezo actuator is to be charged. Alternatively, the future differential voltage can be negative, if the piezo actuator is to be discharged.

The next or future time interval can correspond to the next charging or discharging of the piezo actuator, for example.

In an advantageous refinement of the invention, the future input voltage of the piezo actuator is derived from an audio signal provided for output at the piezoelectric speaker. The audio signal can thereby comprise tones, music, or speech to be output by means of the piezoelectric speaker. The audio signal can also include the signals required for ultrasonic applications. The audio signal thereby varies over time. The audio signal comprises a single frequency in the simplest case, if a tone having the corresponding frequency is to be output at the piezoelectric speaker. In the case of a single tone, the audio signal comprises a single periodic vibration described by a sinusoidal vibration. If speech or music is to be output at the piezoelectric speaker, the audio signal comprises a plurality of frequencies or vibrations. The audio signal is then a complicated time signal. In both cases, however, the piezo actuator is displaced according to the audio signal in order to generate a tone, music, or speech corresponding to the audio signal. The piezo actuator is thus displaced according to the audio signal. The sound quality thus depends on how precisely the displacing of the piezo actuator occurs as a function of the audio signal.

It is advantageous if the electrical energy is transferred from the energy unit to a charging transfer unit and/or from the charging transfer unit into the piezo actuator when charging. In addition or alternatively, the electrical energy can be transferred from the piezo actuator to the charging transfer unit and/or from the charging transfer unit to the energy unit when discharging the piezo actuator. The charging transfer unit can be a coil having an inductivity, for example, so that the electrical energy is stored in the charging transfer unit in the form of an electrical current. An oscillating electrical circuit can thereby be implemented, for example. The oscillating electrical circuit can be implemented between the charging transfer unit and the piezo actuator and/or the energy unit. The electrical energy can then be transferred between the energy unit, the charging transfer unit, and the piezo actuator in a simple manner.

It further advantageous if a future differential electrical energy is derived at least from the future differential voltage. In addition or alternatively, it is advantageous if the future differential electrical energy is derived at least from the measured piezo actuator voltage. The difficulty can arise with the piezo actuator that the relationship between the future differential voltage and the displacement resulting therefrom is not linear. In the general case, the relationship is nonlinear. This can be due to the fact that when the piezo actuator is displaced, the geometry thereof changes, and as a result the capacitance of the piezo actuator changes. The additional displacement when charging or discharging at a particular differential voltage can be different for small displacements than for large displacements. In particular, the capacitance dependent on the displacement can be incorporated by means of deriving the future differential electrical energy. For example, more differential energy may be necessary for displacing the piezo actuator by the same amount for an existing large displacement than for a smaller displacement. In addition, the future differential energy can also depend on the present or momentary piezo actuator voltage. The differential voltage can further be dependent on additional factors, such as resistances in a circuit of the energy unit, the charging transfer unit, and/or the piezo actuator.

The future differential electrical energy can be positive if the piezo actuator is to be charged. Alternatively, the future differential electrical energy can also be negative if the piezo actuator is to be discharged.

The future differential energy can be advantageously transferred from the energy unit into the charging transfer unit when charging. In addition or alternatively, the future differential energy can be transferred form the charging transfer unit into the piezo actuator.

The future differential energy can be advantageously transferred from the piezo actuator into the charging transfer unit when discharging. In addition or alternatively, the future differential energy can be transferred form the charging transfer unit into the energy unit.

If the charging transfer unit is implemented as an inductor, then the future differential energy can be stored in the form of an electric current in the charging transfer unit. The electric current thereby flows through the charging transfer unit.

It is advantageous if a future charging time is derived as a function of the future differential energy. In addition or alternatively, the future charging time can also be derived as a function of the future differential voltage. In addition or alternatively, the future charging time can also be derived as a function of the measured piezo voltage. During the future charging time, the electrical energy, particularly the future differential energy, is transferred from the energy unit into the charging transfer unit.

It is further advantageous if a future discharging time is derived as a function of the future differential energy. In addition or alternatively, the future discharging time can also be derived as a function of the future differential voltage. In addition or alternatively, the future discharging time can also be derived as a function of the measured piezo voltage. During the future discharging time, the electrical energy, particularly the future differential energy, is transferred from the piezo actuator into the charging transfer unit.

The duration for which the piezo actuator is charged or discharged in order to displace the piezo actuator to a lesser or greater extent, in order to generate sound waves having a higher quality according to the audio signal, can thereby be determined. The circuit can also be controlled by means of the charging and/or discharging time. For example, switches of the circuit can be opened and/or closed correspondingly by means of the charging and/or discharging time. The charging and/or discharging time can thereby be corresponding times for switch states or switch settings of the circuit.

It is further advantageous if the charging time and/or the discharging time are stored in a memory unit. The memory unit can be part of the piezoelectric speaker. The charging time and/or the discharging time can be determined and/or selected according to the future input voltage, the present piezo actuator voltage, the future differential voltage and/or the future differential energy. The deriving of the charging and/or the discharging time indicated for a future point in time can thereby be shortened. Said data can be saved as a list in the memory unit. If the piezo actuator voltage is measured and a particular input voltage is present at a future point in time, then the list can be checked as to whether the charging time and/or the discharging time is present. If the values are present, then said values can be accessed without having to be newly derived. The time for deriving the value can thereby be saved.

It is advantageous if the charging and/or the discharging of the piezo actuator is performed by means of a pulse-width modulation method. A pulse width and/or an impulse duration of the pulse-width modulation method can be derived, for example, as a function of the charging time, the discharging time, the differential voltage, and/or the differential energy. Corresponding switches of a circuit can then be controlled for charging and/or discharging the piezo actuator by means of the pulse-width modulation method. The switches of the circuit can be closed and/or opened corresponding to the charging and/or discharging time by means of the pulse-width modulation method.

It is advantageous if the charging, the discharging, and/or the deriving of the differential voltage, the differential energy, the charging time, the discharging time, and/or the determining, particularly the measuring, of the piezo actuator voltage is performed incrementally and/or periodically at a working frequency. The piezo actuator can thereby be charged or discharged incrementally and/or periodically. In addition or alternatively, said values can be calculated incrementally and/or periodically. Because the piezo actuator voltage is measured periodically, for example, and the differential voltage is derived periodically, for example, the piezo actuator voltage, possibly being the input voltage, can be controlled periodically. The working frequency can be in the range of 1 MHz, for example. In addition or alternatively, the working frequency can also be in a range higher than a bandwidth of the audio signal. For audio signals, for example, the bandwidth of up to 20 kHz can be typical. The working frequency can then be 50 times higher, for example. A range of 1 MHz is thereby reached, for example. When ultrasound is generated, the frequency is of course correspondingly higher.

The audio signal thereby changes at a rate no greater than the bandwidth. The sampling period corresponds according to the working frequency to approximately 1 μs, for example. A sound level of the audio signal, which corresponds to the sound waves producing by the piezo speaker, in this example thus changes every 1 μs, or at the sampling frequency of 1 MHz. The displacement of the piezo actuator must thereby also change every 1 μs or at the sampling frequency of 1 MHz in the present example. Since the piezo actuator cannot follow 1 MHz changing frequency, the displacement is the average over many periods of the sampling frequency of 1 MHz.

If the working frequency is 50 times greater than the bandwidth of the audio signal, for example, then the piezo actuator voltage can be measured, the future differential voltage and/or differential energy can be derived, the charging and/or discharging time can be derived, and/or the piezo actuator can be charged and/or discharged 50 times per period of audio signal with the highest frequency. The piezo actuator voltage can thus be controlled 50 times per period of the audio signal. The quality of the sound waves produced can thereby be increased. Sound waves arising during the controlling have a corresponding audio range. Said frequency is in the range of the working frequency, for example, so that the sound waves have a frequency in the range of up to 20 kHz. Sound waves having a frequency that are above the wavelength spectrum audible to the human ear, has little or no effect on the quality of the sound waves, for example the tone, the music, or the speech.

It is advantageous if a period of the working frequency is divided into a first span of time, a second span of time, and a third span of time. The second span of time can thereby follow immediately after the first span of time. In addition or alternatively, the third span of time can follow the second span of time. The charging, the discharging, and/or the deriving of the differential voltage, the differential energy, the charging time, or the discharging time, and/or the measuring of the piezo actuator can be performed in the first, second, and/or third span of time.

It is advantageous if the electrical energy is transferred from the energy unit to the charging transfer unit in the first span of time. The first span of time is the span of time in which the charging of the piezo actuator is prepared, for example.

The transferring of the charging transfer unit from the energy unit can thereby take place at a point in time in the first span of time, so that by the end of the first span of time the differential energy is stored in the charging transfer unit. Because the charging transfer unit can be an inductor, the differential energy can be stored by the inductor in the form of an electric current. The point in time when the charging of the charging transfer unit from the energy unit is begun can be determined by means of the charging time. The future differential energy, particularly derived beforehand, is then pre-sent in the charging transfer unit at the end of the first span of time. The electric current thereby rises during the charging time, if the charging transfer unit is in the form of an inductor, until the differential energy is reached.

It is further advantageous if the charging and/or the discharging of the piezo actuator begins at the beginning of the second span of time. When charging, for example, the energy stored in the charging transfer unit can be transferred to the piezo actuator. If the differential energy has been transferred into the charging transfer unit in the form of the electric current by the end of the first span of time, then it is advantageous if subsequently, that is, at the beginning of the second span of time following the first span of time, the differential energy is transferred to the piezo actuator. Said uninterrupted charging transfer is advantageous because the differential energy is present in the form of the electric current, and said current can flow only in an electrical circuit. During the second span of time, the electrical energy stored in the charging transfer unit drops. If the charging transfer unit is implemented as an inductor, then the electric current through the inductor drops. The electrical energy in the piezo actuator, in contrast, rises during the second span of time. Because the piezo actuator has properties of a capacitor, the electrical voltage of the piezo actuator rises with the electrical energy, as a result of which the displacing of the piezo actuator increases and sound is generated. The times for transferring the electrical energy are thereby derived during the first span of time by means of the derived piezo actuator voltage and the input voltage, for example using the charging time, so that after the electrical energy has been charged from the charging transfer unit to the piezo actuator, said piezo actuator has a displacement corresponding to the provided audio signal. A sound comprising a tone, music, or speech can thereby be generated at a high quality.

The energy stored in the piezo actuator can be transferred into the charging transfer unit during the second span of time when discharging. It is thereby advantageous if no electrical energy is stored in the charging transfer unit. If the charging transfer unit is an inductor, then no electric current flows through the inductor. When discharging, the electrical energy is transferred from the piezo actuator into the charging transfer unit. The electrical voltage of the piezo actuator thereby drops and the electrical energy in the charging transfer unit rises. If the charging transfer unit is implemented as an inductor, then the electric current through the inductor rises. This can occur for the duration of the discharging time. After the discharging time, the electrical of the piezo actuator has been reduced by the differential energy, said energy now being present in the charging transfer unit. By reducing the electrical energy by the differential energy, the displacement of the piezo actuator is reduced. Sound corresponding to the audio signal can thereby be generated.

It is advantageous if the piezo actuator voltage is measured, the piezo actuator voltage is digitalized, the differential voltage, input voltage, and differential energy are derived, the piezo actuator is charged and/or the piezo actuator is discharged in the second span of time. The third span of time can be used for performing calculations of said values. In addition or alternatively, the third span of time can be used for discharging the piezo actuator, for example if the second span of time is not sufficient.

The invention further proposes a circuit for operating a piezoelectric speaker for generating sound waves in the audible wavelength spectrum. The audible wavelength spectrum thereby comprises sound frequencies in the range from approximately 20 Hz to 20 kHz. In addition or alternatively, sound waves in the ultrasonic range can be generated using the piezoelectric loudspeaker. The sound waves then have frequencies above 20 kHz. A piezo actuator of the piezoelectric speaker can be charged and/or discharged by means of the circuit, so that displacements of the piezo actuator can be implemented. The piezo actuator has piezoelectric properties. That is, dis-placements of the piezo actuator can be implemented by means of charging and/or discharging. Said displacements can be transmitted to a membrane, for example, in order to generate the sound waves.

Electrical energy is further able to be transferred between an energy unit and the piezo actuator by means of the circuit.

BRIEF DESCRIPTION OF THE DRAWINGS

Further advantages of the invention are described in the exemplary embodiments below. In the drawings.

DETAILED DESCRIPTION OF EXEMPLARY EMBODIMENTS

Figure 1:
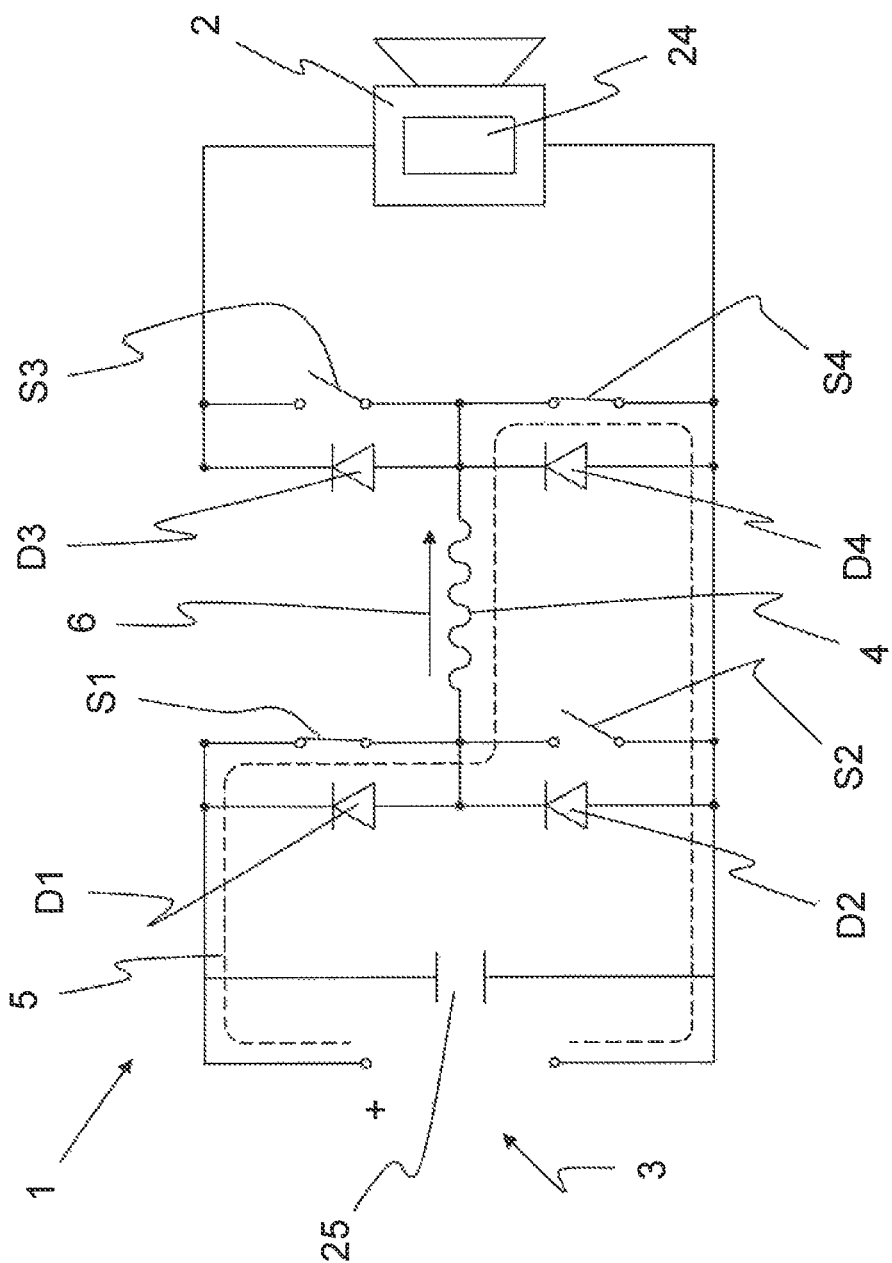
FIG. 1 A schematic representation of an embodiment of a circuit having a switch setting for charging a piezo actuator, FIG. 2 A schematic representation of an embodiment of a circuit having a switch setting for charging a piezo actuator, FIG. 3 A schematic representation of an embodiment of a circuit having a switch setting for discharging a piezo actuator, FIG. 4 A schematic representation of an embodiment of a circuit having a switch setting for discharging a piezo actuator, FIG. 5 A block diagram of a method for operating a piezoelectric speaker, and FIG. 6 A diagram having time-based switch signals, a time-based current curve, and a time-based voltage curve.

FIG. 1 shows a circuit 1 for operating a piezoelectric speaker 2. In the exemplary embodiment shown, a piezo actuator 24 is disposed in the piezoelectric speaker 2 and shown here schematically in connection with a step for charging a piezo actuator 24 of the piezoelectric speaker 2.

The circuit 1 comprises at least one switch S1-S4, and desirably four switches S1, S2, S3 and S4 are provided in the exemplary embodiment of FIG. 1. In addition or alternatively, the circuit comprises at least one diode D1-D4, and desirably four diodes D1, D2, D3 and D4 are provided in the exemplary embodiment of FIG. 1. Electrical energy can be transferred between an energy unit 3 and the piezo actuator 24 of the piezoelectric speaker 2 by means of the at least one switch S1-S4 and the at least one diode D1-D4. According to the present exemplary embodiment of the circuit 1 in FIG. 1, the energy unit 3 and/or the piezoelectric speaker 2 can thereby be connected in the circuit 1 via the four switches S1-S4 and four diodes D1-D4. The energy unit 3 can be a non-rechargeable or rechargeable battery, for example.

The diodes D1-D4 can be used for enabling current flow when the switches S1-S4 have not yet been closed.

A capacitor 25 can be disposed in parallel with the energy unit 3 according to the present exemplary embodiment in order to stabilize a voltage of the energy unit 3.

The piezo actuator 24 has piezoelectric properties. That is, if the piezo actuator 24 is charged or discharged, a displacing of the piezo actuator 24 can be implemented or changed. Sound waves can be generated as a result of the displacing and can comprise a tone, music, or speech. In order to generate the sound waves, the displacement of the piezo actuator 24 can be transmitted to a membrane of the piezoelectric speaker 2. The air disposed above the membrane can be set to vibrating by the displacement of the piezo actuator 24. If the piezo actuator 24 is displaced according to an audio signal, then sound waves can be generated corresponding to the music, speech, or tones present in the audio signal. With the piezoelectric loudspeaker 2 or piezo actuator 24, sound waves in the ultrasonic range can be additionally or alternatively generated. The audio signal then comprises signals that generate ultrasound.

According to the exemplary embodiment shown in FIG. 1, a method is shown wherein electrical energy is transferred from the energy unit 3 to the piezo actuator 24. To this end, electrical energy is transferred from the energy unit 3 to a charging transfer unit 4 of the circuit 1 in a first step. The charging transfer unit 4 is further implemented as an inductor in the present exemplary embodiment.

The +/− polarity shown in FIGS. 1-4 schematically represents the energy unit 3 that can comprise a supply voltage, for example three volts (3 V). According to the step of the method implemented with the present exemplary embodiment of the circuit 1 shown in FIG. 1, the first switch S1 and the fourth switch S4 are closed to transfer electrical energy from the energy unit 3 to a charging transfer unit 4 of the circuit 1. When the switches S1 and S4 are closed as shown in FIG. 1, then an electric current, which is schematically represented by the dashed line designated by the numeral 5 in FIG. 1, can be caused to flow through the charging transfer unit 4 in the current direction that is schematically represented by the arrow designated by the numeral 6 in FIG. 1. Because the charging transfer unit 4 is implemented here as an inductor, the electric current 5 through the charging transfer unit 4 becomes stronger over time, and this electrical energy is stored therein as a function of the electric current 5 through the charging transfer unit 4.

Figure 2:
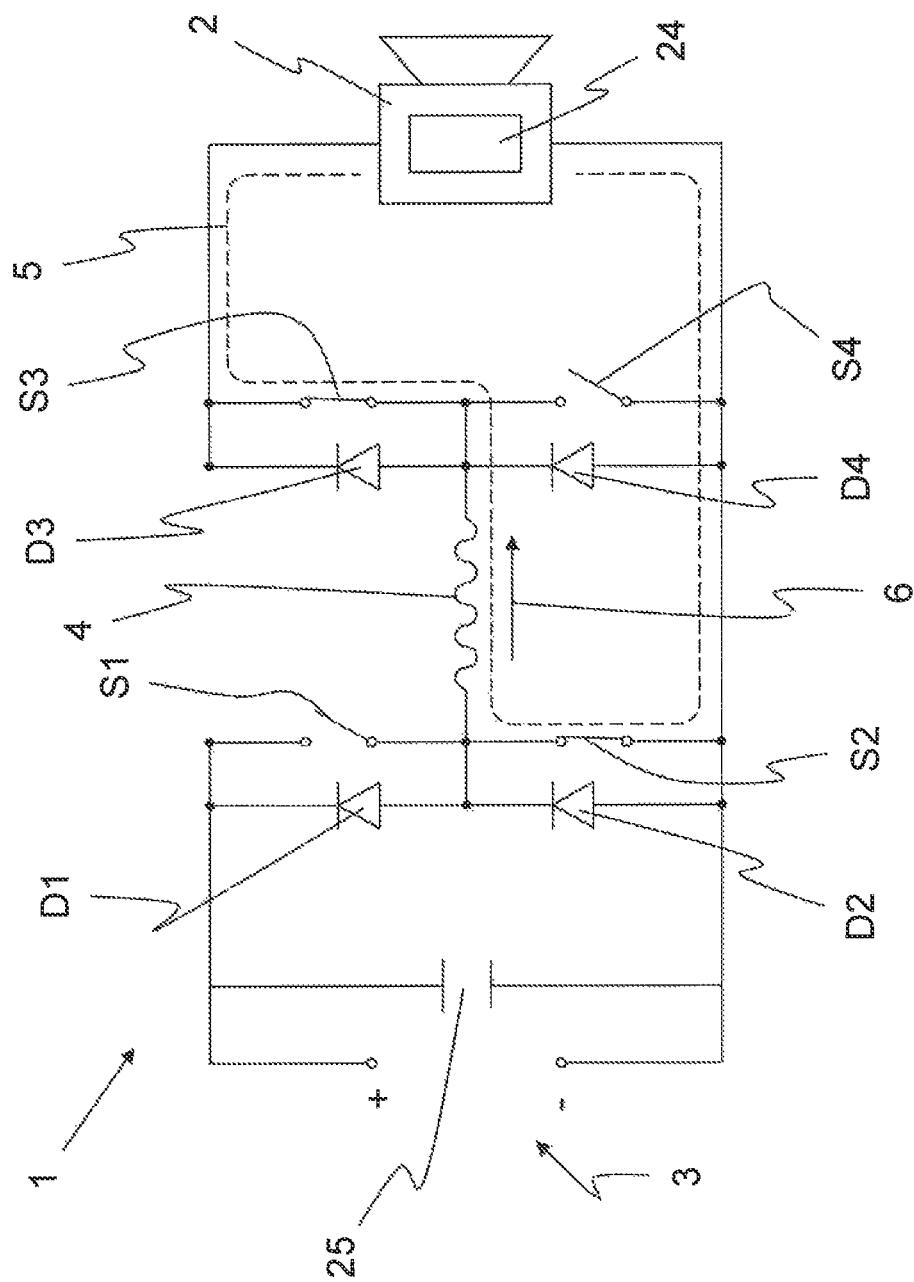

FIG. 2 shows the circuit 1 having a further switch setting for another step of the method of charging the piezo actuator 24 with the electrical energy stored in the charging transfer unit 4. According to this step of the method, a further switch setting of the present exemplary embodiment of the circuit 1 is effected whereby the first switch S1 and the fourth switch S4 are opened, and the second switch S2 and the third switch S3 are closed. The current 5 flows from the charging transfer unit 4 implemented as an inductor to the piezo actuator 24 of the piezoelectric speaker 2. The current 5 thereby flows in the current direction 6 by the pointing arrow in FIG. 2. The electrical energy is thereby transferred from the charging transfer unit 4 to the piezo actuator 24. The current 5 thereby diminishes over time, wherein after a time the current 5 eventually will cease flowing entirely. When the current 5 has ceased, that is, when the current 5 has an amperage of 0 amperes, then the second switch S2 and the third switch S3 can be opened in order to prevent the electrical energy from flowing from the piezo actuator 24 back to the charging transfer unit 4. By charging the piezo actuator 24, the voltage of the piezo actuator 24 has been increased. The charging voltage causes the piezo actuator 24 to become displaced, corresponding to the increased voltage. The displacement of the piezo actuator 24 thereby causes sound waves to be generated.

The piezo actuator 24 can be charged in order to control the displacement thereof by means of the methods shown in FIGS. 1 and 2.

Figure 3:
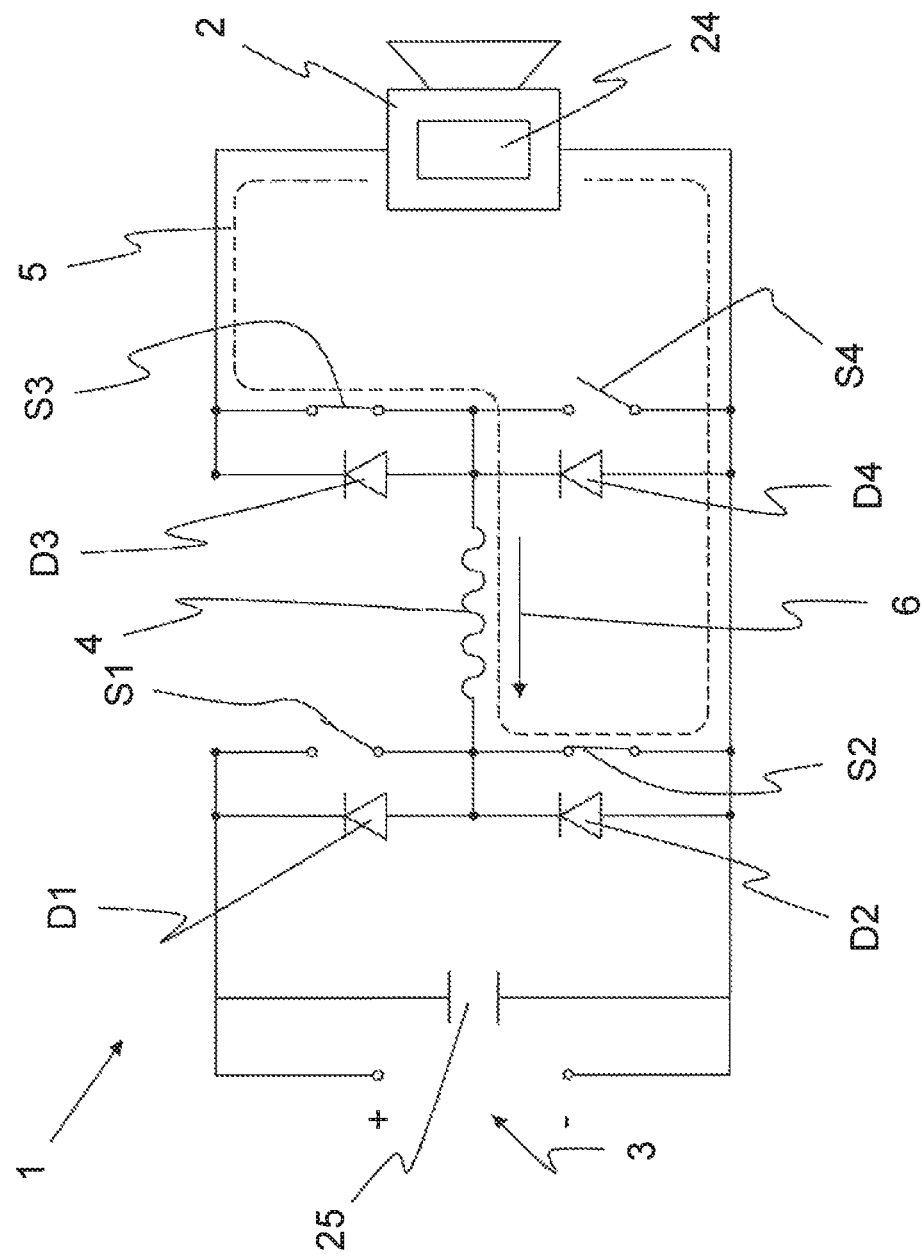

FIG. 3 shows a circuit 1 having a switch setting for discharging the piezo actuator 24 of the piezoelectric speaker 2. To implement this step of the method, the second switch S2 and the third switch S3 are closed, and the first switch S1 and the fourth switch S4 are opened. At the beginning of discharging, the current 5 through the charging transfer unit 4 can be zero. However over time, the electrical voltage of the piezo actuator 24 causes the current 5 to increase. According to the present exemplary embodiment, the current direction 6 schematically shown in FIG. 3 is opposite the current direction for charging schematically shown in FIG. 2. After a time, particularly a discharge time, the current 5 through the charging transfer unit 4 has reached a value, which particularly can be a predetermined value. The second switch S2 and/or the third switch S3 can then be opened so that no current can flow from the piezo actuator 24 to the charging transfer unit 4.

Figure 4:
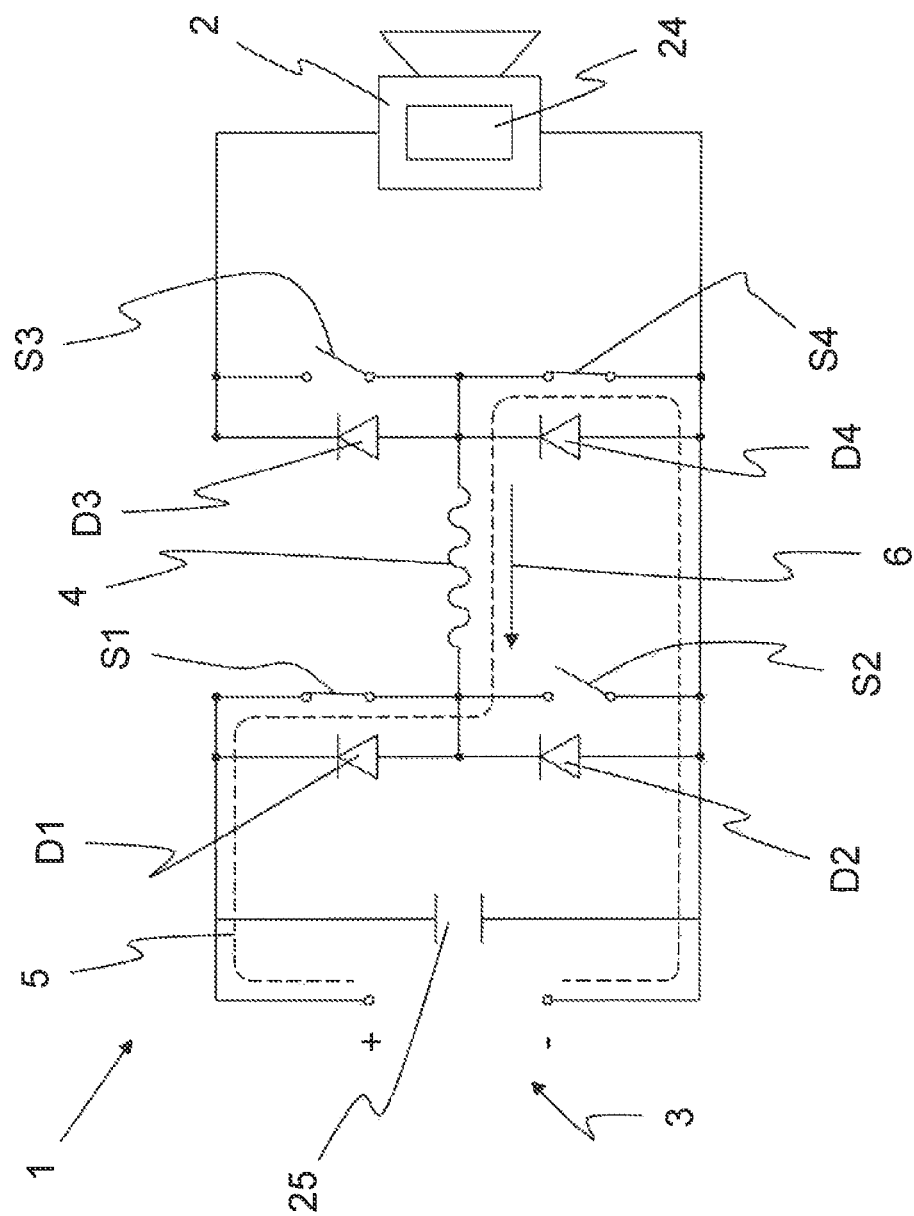

FIG. 4 shows a circuit 1 in a switch setting for discharging the piezo actuator 24. In the exemplary embodiment shown in FIG. 4, the energy stored in the charging transfer unit 4 can be charged back into the energy unit 3. Said energy that is charged back into the energy unit 3 then becomes available again and can be used thereby to minimize the energy consumption for operating the piezoelectric speaker 2.

According to the present exemplary embodiment of the method using the circuit 1 configured as schematically shown in FIG. 4, the switches S2 and S3 are opened, and the first switch S1 and the fourth switch S4 are closed. In the step of the method configuring the circuit 1 schematically shown in FIG. 4 to assume this operational mode, the current 5 flows in the current direction 6 through the charging transfer unit 4 to the energy unit 3.

Figure 5:
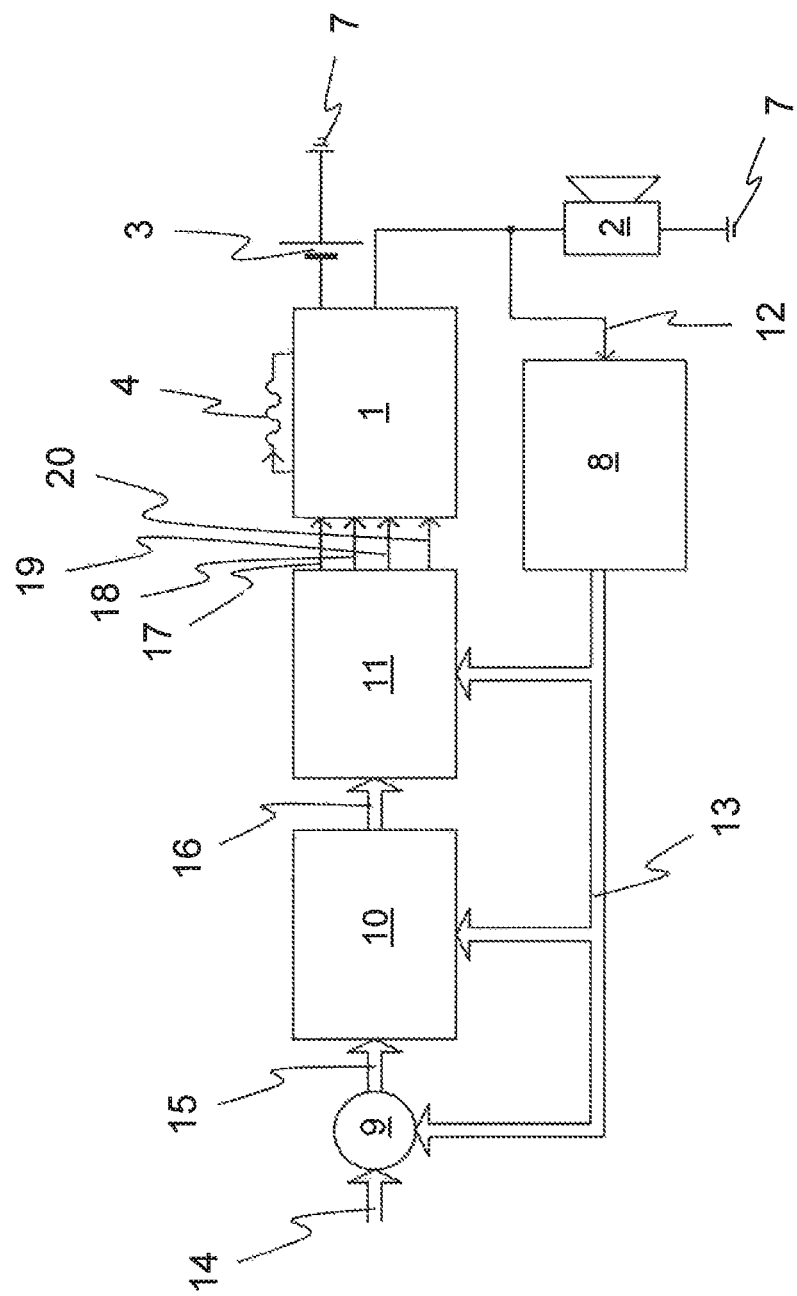

FIG. 5 shows a block diagram of a method for operating the piezoelectric speaker 2. The block diagram shows the circuit 1 for operating the piezoelectric speaker 2 and the energy unit 3. The energy unit 3 and the piezoelectric speaker 2 are connected to a ground 7 as a reference potential according to the present exemplary embodiment. The piezoelectric speaker 2 further comprises the piezo actuator 24, not shown here (see FIGS. 1-4), by means of which the displacement of the piezo actuator 24 and membrane of the speaker 2 can be implemented, so that the sound waves can be generated by the speaker 2. By means of the method schematically shown in the block diagram, the piezo actuator 24 of the piezoelectric speaker 2 can be charged and/or discharged in order to control the displacement of the piezo actuator 24 and membrane of the speaker 2 and thus accordingly generating the sound from the speaker 2.

In the method according to the present exemplary embodiment of FIG. 5, a piezo actuator voltage 12 is measured. The piezo actuator voltage 12 can thereby be read from the side of the piezoelectric speaker 2 opposite the ground 7. The piezo actuator voltage 12 can thereby be measured by a measuring device, not shown here. Said voltage corresponds to the voltage, particularly the momentary voltage, of the piezo actuator 24. The deflection of the piezo actuator 24 can be derived from the piezo actuator voltage 12.

In the present exemplary embodiment, the measured piezo actuator voltage 12 is fed to a first processing unit 8. In addition or alternatively, the first processing unit 8 can also comprise the measuring unit for capturing the piezo actuator voltage 12. The first processing unit 8 can be a digitalizer, for example. Alternatively, the first processing unit 8 can also be an analog-to-digital converter (A/D converter). The first processing unit 8 can digitalize the piezo actuator voltage 12 and output the same as a digital piezo actuator voltage 13. The advantage thereof is that the digital piezo actuator voltage 13 can be easily processed further. Alternatively, the piezo actuator voltage 12 can also serve for further processing.

The digital piezo actuator voltage 13 can further be fed to at least one comparator 9 according to the present exemplary embodiment.

An input voltage, particularly digital, is further fed to the comparator 9. The input voltage 14 can be determined in a method step not shown here from the audio signal provided for outputting at the piezoelectric speaker 2. The audio signal can comprise a time-dependent sound level signal converted into the input voltage 14. The input voltage 14 can correspond to the voltage at which the piezo actuator 24 is charged in order to implement a displacement corresponding to the sound, such as a tone, speech, or music, provided by the audio signal. The input voltage 14 can thereby also be time-dependent. The input voltage 14 is a function of the audio signal. The input voltage 14 is determined such that the resulting displacements of the piezo actuator 24 generate sound waves corresponding to the audio signal.

According to the invention, the input voltage 14 can be determined for a future displacement. The input voltage 14 can also be a future input voltage 14. Future can thereby mean that the input voltage 14 is determined for a future audio signal. The audio signal in this invention can comprise a sampling frequency, for example 1 MHz, or even higher sampling frequencies, and future can mean here that the audio signal is determined for a future sampling period. A sampling period thereby corresponds to the time between two samplings of the audio signal. For the case of 1 MHz, said sampling period corresponds approximately to a time of 1 microsecond (μs) (1/1 MHz). That is, the audio signal changes level only every 1 μs. The future input voltage 14 can be determined for the next sampling interval of the audio signal. The future input voltage 14 can thus be the input voltage 14 to be applied to the piezo actuator 24 in 1 μs in order to generate the sound corresponding to the audio signal.

A difference or differential between the piezo actuator voltage 12 or the digital piezo actuator voltage 13 and the future input voltage 14 can be determined by means of the comparator 9. For example, the piezo actuator 24 can comprise a digital piezo actuator voltage 13 of 21 V. The future input voltage 14, for example the input voltage of the next sampling interval of the audio signal, can be 21.5 V, for example. The future input voltage 14, particularly the next input voltage according to the sampling interval, is thus greater than the present piezo actuator voltage 13. The comparator 9 can derive a future differential voltage 15 therefrom, which in the present example is 0.5 V. Because said voltage is positive, charging of the piezo actuator 24 by the future differential voltage 15 is performed. Alternatively, the determined future differential voltage 15 can also be negative. The digital piezo actuator voltage 13 is then higher than the future input voltage 14. As a result, a discharging of the piezo actuator 24 can be performed.

The future differential voltage 15 is fed to a second processing unit 10 according to the present exemplary embodiment. The second processing unit 10 can comprise a correcting unit, for example, for compensating for the nonlinearity of the piezo actuator 24. The piezo actuator 24 can comprise the nonlinearity, possibly due to the fact that a capacitance changes with the displacement of the piezo actuator 24. A change in the displacement of the piezo actuator 24 can depend on the momentary displacement. If the piezo actuator 24 is already displaced, for example, the further displacing can be less when increasing the piezo actuator voltage 12 than if the piezo actuator 24 is displaced less. Said behavior can be accounted for by means of the second processing unit 10.

The second processing unit 10 can, for example, determine a charging/discharging time 16. If the differential voltage is 0.5 V according to the preceding example, a charging is performed and a charging time 16 is determined. The charging time 16 and the charging/discharging time are thereby the time during which electrical energy is transferred from the energy unit 3 to the piezo actuator 24. The charging time 16 is the time, for example, during which the switch state of FIG. 1 is implemented. The charging time 16 is determined in that a future differential energy is transferred from the energy unit 3 into the charging transfer unit 4. If said future differential energy is transferred to the piezo actuator 24 in a subsequent step, then the piezo actuator voltage 12 increases by the differential voltage 15, in this example by 0.5 V.

In the case that the differential voltage 15 is negative, that is, that the piezo actuator 24 is to be discharged, the discharging time 16 is determined. A switch state is implemented according to FIG. 3 during the discharging time 16, for example, wherein the differential energy is transferred from piezo actuator 24 into the charging transfer unit 4. If the switch state from FIG. 3 is implemented for the discharging time, then the energy in the piezo actuator 24 is reduced by the differential energy, causing a reducing of the piezo actuator voltage 12 by the differential voltage 15. The displacement of the piezo actuator 24 is reduced.

In order to implement the switch states according to one of the exemplary embodiments of FIGS. 1 through 4, the method uses a third processing unit 11 for setting a switch state for charging or discharging the piezo actuator 24. The third processing unit 11 can comprise a pulse-width modulation module, for example, for outputting one or more pulse-width signals, by means of which the corresponding switches S1-S4 can be switched. The circuit 1 can thereby be operated by means of a pulse-width modulation method. The third processing unit 11 can output four switch signals 17-20 to the circuit 1. One respective switch S1-S4 is thereby associated with each respective switch signal 17-20, so that the respective switches S1-S4 can be closed and opened by means of the respective switch signals 17-20 in order to charge or discharge the piezo actuator 24.

According to FIG. 5, at least the piezo actuator voltage 13 can also be fed to the second processing unit 10 and/or to the third processing unit 11. This can be advantageous if the circuit 1 comprises a memory unit, not shown here, in which digital piezo actuator voltages 13 and/or future input voltages 14 are stored. The associated charging/discharging times 16 and/or the associated switch signals 17-20 also can be stored in the memory unit. Existing values can thereby be accessed. Newly calculating the charging/discharging times 16 and/or switch signals 17-20 is then unnecessary.

Figure 6:
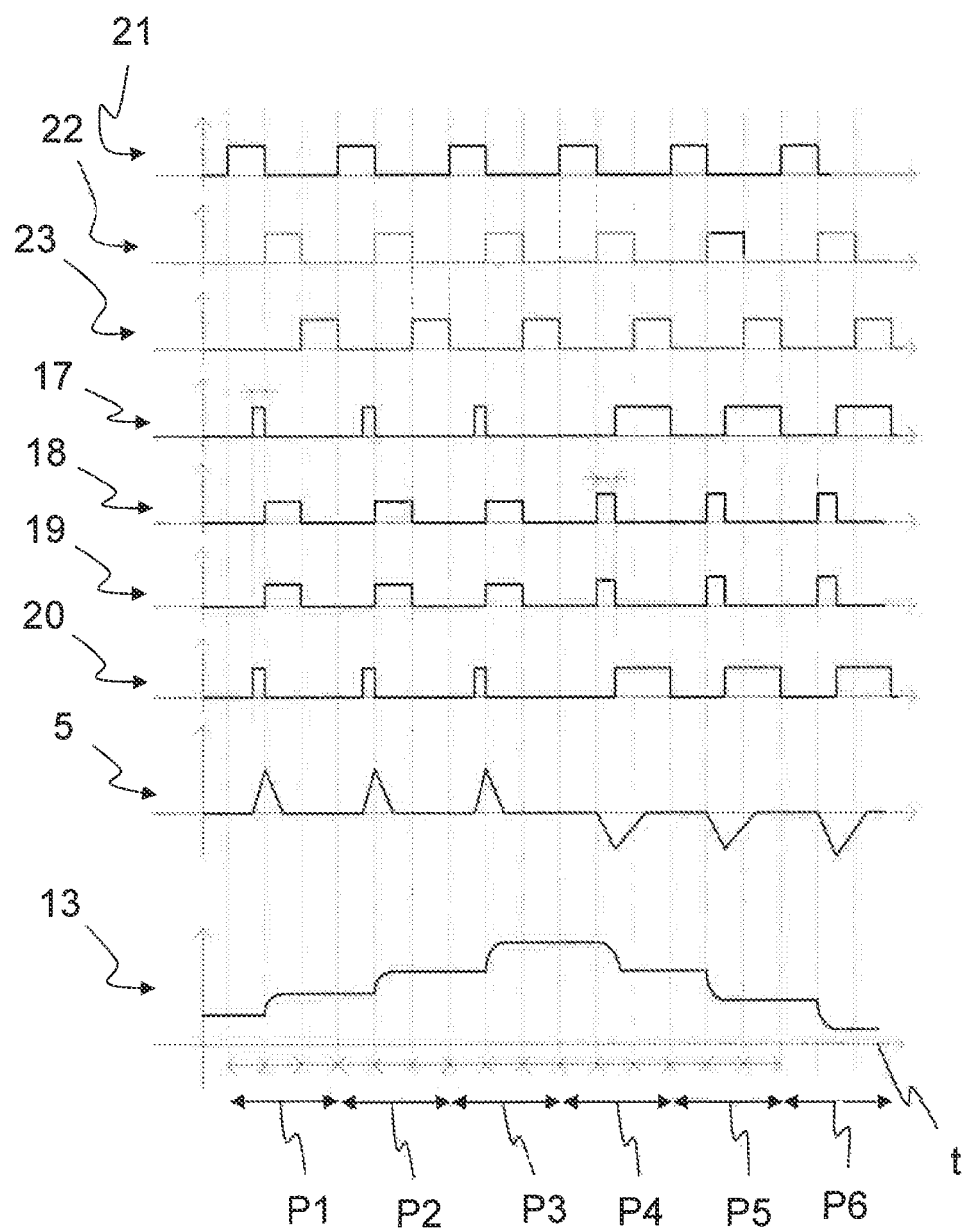

FIG. 6 shows a diagram having time-based switch signals 17-20, a time-based current curve 5, and a time-based voltage curve 13. The diagram in FIG. 6 can show a time-based sequence of switch states, for example, by means of which the circuit 1 can be operated according to FIGS. 1-4. Three spans of time 21, 22, 23 are shown in the top region of the diagram in FIG. 6. A high level of the curves of the three spans of time 21, 22, 23 in FIG. 6 thereby means that the corresponding span of time is present.

In FIG. 6, the switch signals 17-20 of the four associated switches S1-S4 are shown below said region. According to the present exemplary embodiment, the switch signal 17 is associated with the first switch S1, the second switch signal 18 is associated with the second switch S2, the third switch signal 19 is associated with the third switch S3, and the fourth switch signal 20 is associated with the fourth switch S4. A high level in FIG. 6 thereby indicates that the associated switch S1-S4 is closed, so that a current can flow through the corresponding switch S1-S4. A low level in FIG. 6 indicates that the associated switch S1-S4 is open, so that an electrical circuit is interrupted.

In FIG. 6, the time-based curve of the current 5 flowing through the charging transfer unit 4, implemented as an inductor according to FIGS. 1-5, is shown below the switch signals 17-20.

The digital piezo actuator voltage 13 is shown in the bottom region of the diagram in FIG. 6. Instead of the digital piezo actuator voltage 13, the (analog) piezo actuator voltage 12 could also be shown, as both have the same curve.

The X-axis in FIG. 6 further indicates the time t, wherein a plurality of periods P1-P6 of the working frequency of the circuit 1 are labeled. The diagram shown shows only an excerpt. One period P1-P6 of the working frequency is the sum of the three spans of time 21, 22, 23 in the present exemplary embodiment. Corresponding to the repeating of the periods P1-P6, the three spans of time 21, 22, 23 also repeat. According to the present exemplary embodiment, the three spans of time 21, 22, 23 divide the periods P1-P3 into three regions of equal time.

According to the exemplary embodiment shown in FIG. 6, the first span of time is disposed at the beginning of the periods P1-P6. The second span of time 22 follows the first span of time and then the third span of time 23 follows the second span of time.

The first time segment 21 is disposed at the beginning of the period P1. From a preceding period P it has been determined according to the present exemplary embodiment that the future input voltage 14 is greater than the present digital piezo actuator voltage 13. That is, the piezo actuator 24 is being charged. For the first period P1 in the diagram, switch signals 17-20 are determined for the switches S1-S4, such that the piezo actuator voltage 13 is increased by the differential voltage 15. To this end, the differential energy is transferred from the energy unit 3 to the piezo actuator 24.

To this end, the associated switches S1 and S4 are closed during the first time segment 21 of the first period P1 according to the switch signals 17 and 20 schematically shown in FIG. 6. The two switch signals 18 and 19 are at a low level in FIG. 6 so that the associated switches S2 and S3 are open during the first time segment 21 of the first period P1. A switch setting according to FIG. 1 is thus implemented in the first span of time 21 of the first period P1. The time for which the switches S1 and S4 are closed according to the switch signals 17 and 20 in the first span of time 21 of the first period P1 can correspond to the charging time in which the differential energy is transferred from the energy unit 3 into the charging transfer unit 4. The charging time corresponds to the width of the switch signals 17 and 20 in the first period P1. The charging time begins at a point in time in the first span of time 21 of the first period P1, so that the differential energy is in the charging transfer unit 4 by the end of the first span of time 21. The current 5 in the charging transfer unit 4 further increases during the first span of time 21, particularly due to the inductivity. The differential energy is thereby stored in the charging transfer unit 4.

As schematically shown in FIG. 6, the second span of time 22 of the first period P1 immediately follows the first span of time 21. A further switch setting is determined for the second span of time 22, corresponding to the closed switches S2 and S3 according to the switch signals 17-20 of the present exemplary embodiment. The switches S1 and S4 are open and corresponds to a switch setting of the circuit 1 according to FIG. 2, for example.

The energy stored in the charging transfer unit 4 according to the exemplary embodiment is transferred to the piezo actuator 24 via the electrical circuit implemented by the switches S2 and S3. The energy in the charging transfer unit 4 thereby drops according to the current 5 at the beginning of the second span of time 22. While the energy is being transferred form the charging transfer unit 4 to the piezo actuator 24, the digital piezo actuator voltage 13 increases according to the bottom curve of the diagram in FIG. 6. When the energy has been transferred from the charging transfer unit 4 to the piezo actuator 24, the switches S2 and S3 can be closed.

As schematically shown in FIG. 6, the third span of time 23 of the first period P1 immediately follows the second span of time 22. During this third span of time 23, all switches S1-S4 are open according to the switch signals 17-20 in the period P1. During this third span of time 23, the digital piezo actuator voltage 13 can be measured and compared with the future input voltage 14, not shown here. The future input voltage 14 can be the input voltage for the next period P, for the second period P2 according to the present exemplary embodiment. According to the present exemplary embodiment, the future input voltage 14 for the second period P2 is greater than the digital piezo actuator voltage 13 of the first period P1. The positive differential voltage 15 can be derived therefrom in the third span of time 23, so that further charging or a further charging cycle is performed. The charging time and the switch signals 17-20 for the switches S1-S4 for the second period P2 can also be determined in the third span of time 23. The piezo actuator 24 is charged again in the second period P2. According to the present exemplary embodiment, the piezo actuator 24 is also charged in the third period P3. The piezo actuator voltage 13 also rises in the third period P3.

The digital piezo actuator voltage 13 can also be determined and compared with the future input voltage 14 in the third span of time 23 of the third period P3. In the third period P3 it is determined that the digital piezo actuator voltage 13 is too high in comparison with the future input voltage 14. Discharging is therefore prepared for the fourth period P4 following the third period P3. The future differential voltage 15, now being negative, the differential energy charged from the piezo actuator 24 into the charging transfer unit 4, the discharging time, and/or the switch signals 17-20 can be determined during the third span of time 23 of the third period P3.

All switches S1-S4 are open according to the switch signals 17-20 in the first span of time 21 of the fourth period P4, so that no current can flow and thus no energy can be transferred. During this time, no energy is present in the charging transfer unit 4. The charging transfer unit 4 can thereby receive energy. At the beginning of the second span of time 22 of the fourth period P4, the switches S2 and S3 are closed, so that energy from the piezo actuator 24 is charged into the charging transfer unit 4. The two switches S1 and S4 remain open. Said switch setting is shown in FIG. 3 for example. The curve of the current 5 now has a negative curve. That is, the current 5 flows through the charging transfer unit 4 in the opposite direction as for charging. After the discharging time in the second span of time 22, the switches S2 and S3 are closed, because the differential energy is present in the charging transfer unit 4 and can be proportional to the current 5 through the charging transfer unit 4. Thereafter, and still during the second span of time 22, the switches S1 and S4 are closed, so that the energy stored in the charging transfer unit 4 is transferred back into the energy unit 3. Said setting of the switches S1-S4 is shown in FIG. 4. When the energy is transferred from the charging transfer unit 4 to the energy unit 3, then the current 5 through the charging transfer unit 4 drops (the magnitude of the current 5 drops). By charging the energy from the piezo actuator 24 at least to the charging transfer unit 4, the digital piezo actuator voltage 13 has dropped. The discharging of the piezo actuator 24 is performed for the further periods P5 and P6, according to the present exemplary embodiment.

The periods P1-P6 shown in FIG. 6 can be the periods of the working frequency. If the working frequency is 1 MHz, for example, then one period P1-P6 comprises 1 μs. That is, one charging or discharging cycle can be performed within 1 μs. The three spans of time 21, 22, 23, during which the piezo actuator 24 is charged or discharged and the charging and the discharging are determined for the next or future periods P, together comprise 1 μs. Because the sampling period of the audio signal comprises 1 μs, the digital piezo actuator voltage 13 and thus the displacement of the piezo actuator 24 can be adjusted correspondingly often in one sampling period of the audio signal. A potential deviation of the digital piezo actuator voltage 13 and thus a potential deviation of the displacement of the piezo actuator 24 causes sound waves that have a correspondingly high frequency in the range of 1 MHz. Such high frequencies, however, are not perceptible to the human ear, so that the controlling of the digital piezo actuator voltage 13 does not influence the quality of the music, speech, or tones.

The present invention is not limited to the exemplary embodiments shown and described. Modifications in the context of the patent claims are also possible, as is a combination of features, even if these are shown and described in different exemplary embodiments.

REFERENCE LIST

1 Circuit
2 Piezoelectric speaker
3 Energy unit
4 Charging transfer unit
5 Current
6 Current direction
7 Ground
8 First processing unit
9 Comparator
10 Second processing unit
11 Third processing unit
12 Piezo actuator voltage
13 Digital piezo actuator voltage
14 Input voltage
15 Differential voltage
16 Charging/discharging time
17 First switch signal
18 Second switch signal
19 Third switch signal
20 Fourth switch signal
21 First span of time
22 Second span of time
23 Third span of time
24 Piezo actuator
25 Capacitor
D1 First diode
D2 Second diode
D3 Third diode
D4 Fourth diode
S1 First switch
S2 Second switch
S3 Third switch
S4 Fourth switch
t Time
P1-P6 Periods of the working frequency

What is claimed is:

1. A method for operating a piezoelectric speaker for generating sound waves in the audible wavelength spectrum and/or in the ultrasonic range, the method comprising:
    at least partially charging a piezo actuator of the piezoelectric speaker with electrical energy from an energy unit and then at least partially discharging the piezo actuator so as to generate a sound wave;
    wherein when charging the piezo actuator, the electrical energy from the energy unit is first charged to a transfer charging unit and then transferred from the transfer charging unit to the piezo actuator;
    determining at least one present electrical piezo actuator voltage of the piezo actuator;
    performing a comparison of a future input voltage for the piezo actuator with the present electrical piezo actuator voltage prior to charging and/or discharging; and
    deriving a first future differential voltage from the comparison.

2. The method according to claim 1, wherein the future input voltage of the piezo actuator is derived from an audio signal intended for outputting at the piezoelectric speaker.

3. A method for operating a piezoelectric speaker for generating sound waves in the audible wavelength spectrum and/or in the ultrasonic range, the method comprising:
    at least partially charging a piezo actuator of the piezoelectric speaker with electrical energy from an energy unit and then at least partially discharging the piezo actuator so as to generate a sound wave;
    wherein when discharging the piezo actuator, the electrical energy is first charged from the piezo actuator to the transfer charging unit and then transferred from the transfer charging unit to the energy unit;
    determining at least one present electrical piezo actuator voltage of the piezo actuator;
    performing a comparison of a future input voltage for the piezo actuator with the present electrical piezo actuator voltage prior to charging and/or discharging; and
    deriving a first future differential voltage from the comparison.

4. The method according to claim 1, further comprising the step of using the first future differential voltage as the basis for deriving a second future differential electrical energy for charging the piezo actuator.

5. The method according to claim 1, further comprising the step of using the measured piezo actuator voltage as the basis for deriving a second future differential electrical energy.

6. The method according to claim 1, further comprising the step of determining a future charging time during which the electrical energy is charged from the energy unit into the transfer charging unit wherein the future charging time depends on the future differential energy, the future differential voltage, and/or the measured piezo actuator voltage.

7. The method according to claim 1, further comprising the step of determining a future discharging time during which the electrical energy is charged from the piezo actuator to the transfer charging unit wherein the future discharging time depends on the future differential energy, the future differential voltage, and/or the measured piezo actuator voltage.

8. The method according to claim 6, further comprising the step of saving the charging time in a memory unit wherein the charging time is determined based on the future input voltage, the present piezo actuator voltage, the future differential voltage.

9. The method according to claim 7, further comprising the step of saving the discharging time in a memory unit wherein the discharging time is determined based on the future input voltage, the present piezo actuator voltage, the future differential voltage, and the future differential energy.

10. The method according to claim 1, wherein the charging and/or the discharging of the piezo actuator is performed by means of a pulse-width-modulation method.

11. The method according to claim 1, wherein the charging, the discharging, and/or the deriving of the differential voltage, the differential energy, the charging time, or the discharging time, and/or the determining of the piezo actuator voltage is performed incrementally.

12. The method according to claim 1, wherein the charging, the discharging, and/or the deriving of the differential voltage, the differential energy, the charging time, or the discharging time, and/or the determining of the piezo actuator voltage is performed periodically at a working frequency.

13. The method according to claim 1, wherein a period (P1-P6) of the working frequency is divided into a first span of time, into a second span of time subsequent to the first span of time, and into a third span of time subsequent to the second span of time.

14. The method according to claim 13, wherein the electrical energy is charged from the energy unit to the transfer charging unit in the first span of time, wherein the charging of the transfer charging unit from the energy unit takes place at a point in time such that the differential energy is stored in the transfer charging unit at the end of the first span of time.

15. The method according to claim 13, wherein the charging or discharging of the piezo actuator begins at the beginning of the second span of time.

16. The method according to claim 13, wherein the piezo actuator voltage is measured, the differential voltage, the input voltage, or the difference energy is derived, and/or the piezo actuator is discharged in the third span of time.

17. A circuit for operating a piezoelectric speaker for generating sound waves in the audible wavelength spectrum and/or in the ultrasonic range, a piezo actuator of the piezoelectric speaker being able to be charged and/or discharged by means of the circuit, such that deflections of the piezo actuator can be shaped such that the sound waves can be generated, electrical energy being able to be charged between an energy unit and the piezo actuator by means of the circuit, wherein the circuit is configured for operating the piezoelectric speaker according to a method comprising the following steps:
- at least partially charging a piezo actuator of the piezoelectric speaker with electrical energy from an energy unit and then at least partially discharging the piezo actuator so as to generate a sound wave;
- wherein when charging the piezo actuator, the electrical energy from the energy unit is first charged to a transfer charging unit and then transferred from the transfer charging unit to the piezo actuator;
- determining at least one present electrical piezo actuator voltage of the piezo actuator;
- performing a comparison of a future input voltage for the piezo actuator with the present electrical piezo actuator voltage prior to charging and/or discharging; and
- deriving a future differential voltage from the comparison.

* * * * *